(12) United States Patent
Lee et al.

(10) Patent No.: US 7,961,491 B2
(45) Date of Patent: Jun. 14, 2011

(54) DATA STORAGE DEVICE USING MAGNETIC DOMAIN WALL MOVEMENT AND METHOD OF OPERATING THE SAME

(75) Inventors: Sung-chul Lee, Yongin-si (KR); Sung-hoon Choa, Yongin-si (KR); Eun-sik Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1109 days.

(21) Appl. No.: 11/730,121

(22) Filed: Mar. 29, 2007

(65) Prior Publication Data

US 2008/0100963 A1    May 1, 2008

(30) Foreign Application Priority Data

Oct. 27, 2006 (KR) .................. 10-2006-0105273

(51) Int. Cl.
  *G11C 19/00* (2006.01)
(52) U.S. Cl. .......... 365/81; 365/130; 365/158; 365/173; 365/230.07; 365/243.5; 977/933; 977/935
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 2004/0251232 A1* | 12/2004 | Chen et al. | 216/22 |
| 2004/0252538 A1* | 12/2004 | Parkin | 365/80 |
| 2004/0252539 A1* | 12/2004 | Parkin | 365/80 |
| 2005/0078509 A1* | 4/2005 | Parkin | 365/158 |
| 2005/0078511 A1* | 4/2005 | Parkin | 365/171 |
| 2005/0094427 A1* | 5/2005 | Parkin | 365/80 |
| 2005/0186686 A1* | 8/2005 | Chen et al. | 438/3 |
| 2006/0028866 A1* | 2/2006 | Parkin | 365/173 |
| 2006/0120132 A1* | 6/2006 | Parkin | 365/80 |
| 2007/0087454 A1* | 4/2007 | Chen et al. | 438/3 |
| 2008/0094760 A1* | 4/2008 | Lee et al. | 360/324.11 |
| 2008/0100963 A1* | 5/2008 | Lee et al. | 360/131 |
| 2008/0137521 A1* | 6/2008 | Lee et al. | 369/126 |

* cited by examiner

*Primary Examiner* — Richard Elms
*Assistant Examiner* — Harry W Byrne
(74) *Attorney, Agent, or Firm* — Harness, Dickey & Pierce, P.L.C.

(57) ABSTRACT

Provided are a data storage device using a magnetic domain wall movement and a method of operating the data storage device. The data storage device includes a magnetic layer which has a plurality of magnetic domains, a current applying unit which applies current for a magnetic domain wall movement to the magnetic layer, and a head for reading and writing, wherein the magnetic layer comprises a plurality of perpendicular magnetic layers formed on a substrate in a plurality of rows and columns, and a horizontal magnetic layer formed on the perpendicular magnetic layers to connect the perpendicular magnetic layers.

13 Claims, 5 Drawing Sheets

DATA STORAGE DEVICE USING MAGNETIC DOMAIN WALL MOVEMENT AND METHOD OF OPERATING THE SAME

CROSS-REFERENCE TO RELATED PATENT APPLICATION

This application claims the priority from Korean Patent Application No. 10-2006-0105273, filed on Oct. 27, 2006, in the Korean Intellectual Property Office, the disclosure of which is incorporated herein in its entirety by reference.

BACKGROUND OF THE INVENTION

1. Field of the Invention

Devices and methods consistent with the present invention relate to a data storage device, and more particularly, to a data storage device using a magnetic domain wall movement of a magnetic material and a method of operating the data storage device.

2. Description of the Related Art

A minute magnetic region that constitutes a ferromagnetic body is referred to as a magnetic domain. The rotation of electrons in a magnetic domain, that is, the direction of a magnetic moment is identical. The size and magnetization direction of magnetic domain can be appropriately controlled by the shape and size of a magnetic substance and external energy.

A magnetic domain wall is a boundary portion of a magnetic domain having a magnetization direction different from another magnetic domain. The magnetic domain wall can be moved by an external magnetic field or by a current applied to a magnetic substance. That is, a plurality of magnetic domains having a specific magnetization direction can be formed in a magnetic layer having a predetermined width and thickness, and the magnetic domains can be moved using a magnetic field or a current having an appropriate strength.

The principle of the magnetic domain wall movement can be applied to data storage devices. For example, when magnetic domains pass through a read/write head by a magnetic domain wall movement, an operation of reading/writing data is possible without rotating a recording medium. Since data storage devices using a magnetic domain wall movement have a relatively simple structure and a small bit size, every large storage capacity at a terabit-level can be achieved.

However, since such data storage devices are in the first stage of development, several problems should be solved so as to obtain high integration and large capacity. In particular, in data storage device using the magnetic domain wall movement, since reading/writing operations are performed while pushing and pulling the magnetic domain wall, a buffer area is required as a temporary storage. The buffer area reduces the available recording density of a magnetic layer.

Accordingly, in order to realize a small-sized mass storage device using the magnetic domain wall movement, a reduction of the recording density due to the buffer area should be minimized.

In addition, in order to realize a mass storage, a distance between the buffer area and a storage area which is a real data storage should be minimized, and thus a data access time should be reduced.

SUMMARY OF THE INVENTION

The present invention provides a data storage device using a magnetic domain wall movement which can minimize a reduction of the recording density due to a buffer area and reduce a data access time.

The present invention also provides a method of operating the data storage device.

According to an aspect of the present invention, there is provided a data storage device including a magnetic layer which has a plurality of magnetic domains, a current applying unit which applies a current for a magnetic domain wall movement to the magnetic layer, and a head for reading and writing, wherein the magnetic layer includes a plurality of perpendicular magnetic layers formed on a substrate in a plurality of rows and columns, and a horizontal magnetic layer formed on the perpendicular magnetic layers to connect the perpendicular magnetic layers.

The horizontal magnetic layer may include a first horizontal magnetic layer which is formed on the perpendicular magnetic layers of a middle column so as to be connected to the perpendicular magnetic layers of the middle column; a second horizontal magnetic layer which extends from both sides of the first horizontal magnetic layer and is formed so as to be connected to the perpendicular magnetic layers of each row.

The first horizontal magnetic layer may include dot patterns which are formed on the perpendicular magnetic layers of the middle column; and connection patterns which connect the dot patterns.

A resistance magnetic layer having higher electric resistance than that of the magnetic layer may be interposed between each of the perpendicular magnetic layers and the horizontal magnetic layer.

A resistance magnetic layer which has higher electric resistance than that of the magnetic layer may be interposed between the first horizontal magnetic layer and the second horizontal magnetic layer.

A resistance magnetic layer which has higher electric resistance than that of the magnetic layer may be interposed between each of the dot patterns and the connection patterns.

At least one of the perpendicular magnetic layers may act as a buffer area during reading/writing operations.

At least one of the perpendicular magnetic layers of the middle column may act as a buffer area during reading/writing operations.

A central layer of perpendicular magnetic layers of the middle column may act as a buffer area during reading/writing operations.

The current applying unit may comprise a transistor which is connected to a lower surface of each of the perpendicular magnetic layers.

The head may include a write head and a read head.

The head may be formed on parts of the horizontal magnetic layers adjacent to the buffer area.

The head may be formed on the side of the upper part of the buffer area.

According to another aspect of the present invention, there is provided a method of operating a data storage device including a magnetic layer having a plurality of perpendicular magnetic layers formed on a substrate in a plurality rows and columns, a horizontal magnetic layer formed on the perpendicular magnetic layers so as to connect the perpendicular magnetic layers, and a plurality of magnetic domains, and a write head writing data on the magnetic layer, the method including: applying a first current between a first perpendicular magnetic layer and a second perpendicular magnetic layer so as to move magnetic domains by one bit from the first perpendicular magnetic layer to the second perpendicular magnetic layer and recording data on the magnetic domains using the writing head; and applying a second current between the first perpendicular magnetic layer and the second perpendicular magnetic layer so as to move the magnetic domains by one bit, in which the data is recorded, from the second perpendicular magnetic layer to the first perpendicular magnetic layer.

The horizontal magnetic layer may include a first horizontal magnetic layer formed on the perpendicular magnetic layers of a middle column so as to be connected to the perpendicular magnetic layers of the middle column; and a second horizontal magnetic layer which extends from both sides of the first horizontal magnetic layer and formed so as to be connected the perpendicular magnetic layers of each row.

The second perpendicular magnetic layer may be the central layer of the perpendicular magnetic layers.

According to another aspect of the present invention, there is provided a method of operating a data storage device including a magnetic layer having a plurality of perpendicular magnetic layers formed on a substrate in a plurality rows and columns, a horizontal magnetic layer formed on the perpendicular magnetic layers so as to be connected to the perpendicular magnetic layers, and a plurality of magnetic domains, and a read head reading data recorded in the magnetic layer, the method including: applying a first current between a first perpendicular magnetic layer and a second perpendicular magnetic layer so as to move magnetic domains by one bit from the first perpendicular magnetic layer to the second perpendicular magnetic layer and recording data recorded in the magnetic domains using the read head; and applying a second current between the first perpendicular magnetic layer and the second perpendicular magnetic layer so as to move the magnetic domains by one bit from the second perpendicular magnetic layer to the first perpendicular magnetic layer.

The horizontal magnetic layer may include a first horizontal magnetic layer formed on the perpendicular magnetic layers of a middle column so as to be connected to the perpendicular magnetic layers of the middle column; and a second horizontal magnetic layer which extends from both sides of the first horizontal magnetic layer and formed so as to be connected to the perpendicular magnetic layers of each row.

The second perpendicular magnetic layer may be the central layer of the perpendicular magnetic layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS OF THE INVENTION

Figure 1:
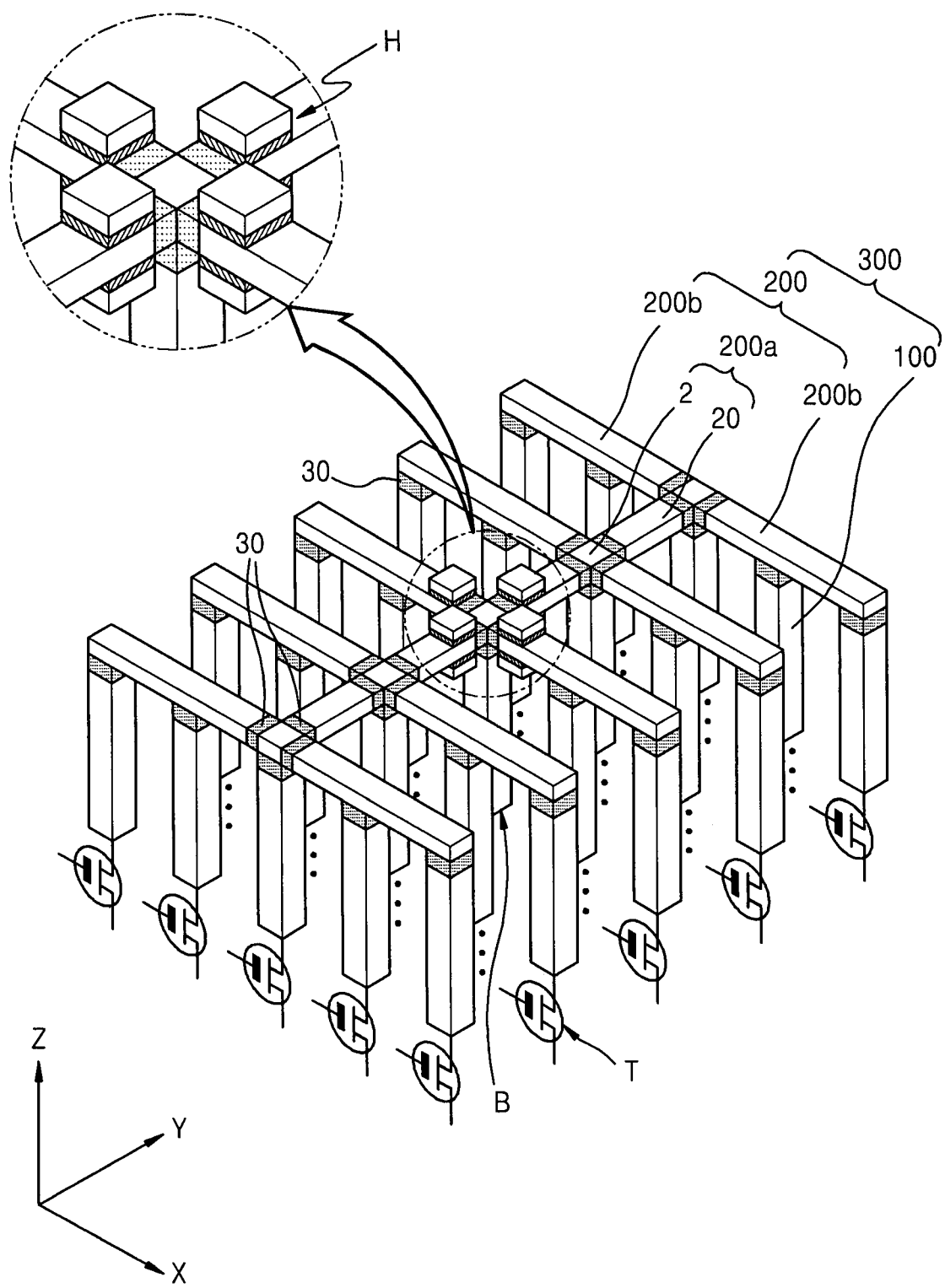
FIG. 1 is a schematic perspective view of a data storage device using a magnetic domain wall movement, according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will convey the concept of the invention to those skilled in the art. In the drawings, the thickness of layers and region are exaggerated for clarity.

FIG. 1 is a schematic perspective view of a data storage device using a magnetic domain wall movement, according to an exemplary embodiment of the present invention.

Referring to FIG. 1, a magnetic layer 300 of the data storage device using a magnetic domain wall movement according to the current exemplary embodiment of the present invention (hereinafter referred to as 'data storage device of the present invention') includes a plurality of perpendicular magnetic layers 100 and a horizontal magnetic layer 200. The perpendicular magnetic layers 100 are formed on a substrate (not shown) and have a plurality rows and columns. The horizontal magnetic layers 200 are formed on the perpendicular magnetic layers 100 to connect the perpendicular magnetic layers 100. The perpendicular magnetic layers 100 include 5 columns and 5 rows in X and Y directions as illustrated in FIG. 1. Although not illustrated in FIG. 1, the magnetic layer 300 may include a plurality of magnetic domains. In addition, notches may be formed in the magnetic layer 300 in order to improve the stability of bit unit movement of the magnetic domain wall.

The horizontal magnetic layer 200 includes a first horizontal magnetic layer 200a formed on the perpendicular magnetic layers 100 of a middle column so as to be connected to the perpendicular magnetic layers 100 of the middle column, and second horizontal magnetic layers 200b extending from both sides of the first horizontal magnetic layer 200a and formed so as to be connected to the perpendicular magnetic layers 100 of each row. That is, the perpendicular magnetic layers 100 are connected by the first horizontal magnetic layer 200a in the Y direction.

The first horizontal magnetic layer 200a includes dot patterns 2 formed on the perpendicular magnetic layers 100 of the middle column, and connection patterns 20 connecting the dot patterns 2.

A plurality of resistance magnetic layers 30 having higher electric resistance than that of the magnetic layer 300 may be each interposed between the perpendicular magnetic layers 100 and the horizontal magnetic layer 200, between the first horizontal magnetic layer 200a and the second horizontal magnetic layers 200b, and between the dot patterns 2 and the connection patterns 20. The specific resistance of the resistance magnetic layers 30 may be 500 through 10000 times, or may further be 1000 through 3000 times, higher than that of the magnetic layer 300. To achieve this specific resistance difference, the magnetic layer 300 may be formed of one selected from the group consisting of Ni—Fe, Co, Co—Ni, Co—Fe, Co—Cr, Co—Cu, Ni—Cu, Fe—Pt, Fe—Pd, Co—Cr—Pt, CoFeTb, CoFeGd, CoTh and Co—Fe—Ni, and the resistance magnetic layers 30 may be formed of amorphous Co—Zr—Nb, Co—Fe—B, or a magnetic material including impurities such as Si, B, or the like to have high specific resistance.

When a current is applied between a first predetermined part of the magnetic layer 300 and a second predetermined part of the magnetic layer 300, the resistance magnetic layers 30 prevent the current from leaking to an undesired part. This will be described in detail later. At least one of the perpendicular magnetic layers 100 functions as a buffer area during read/write operations. A central layer of the perpendicular magnetic layers 100 may function as a common buffer area B.

As illustrated in FIG. 1, the central layer of the perpendicular magnetic layers 100 is defined as the common buffer area B, and then the other perpendicular magnetic layers 100 are available storage areas. Since the central layer of the perpendicular magnetic layers 100 is the common buffer area B in the perpendicular magnetic layers 100 constituting a two dimensional arrangement, the ratio of a buffer area with respect to a storage area is minimized, and a movement distance between the buffer area and the storage area is minimized.

In order to move the magnetic domain wall of the magnetic layer 300, a current applying unit applying a current to the magnetic layer 300 is required. In the current exemplary embodiment, the current applying unit may be a transistor. A plurality of transistors T are each connected to lower surface of the perpendicular magnetic layers 100. The transistors T formed on a substrate (not shown) are easily connected to the perpendicular magnetic layers 100.

By controlling the transistors T, a part performing the read/write operations of the magnetic layer 300 can be specified, and the movement direction of the magnetic domain walls of the part of the magnetic layer 300 can be determined. For example, by controlling a first transistor connected to a first predetermined perpendicular magnetic layer and a second transistor connected to a second predetermined perpendicular magnetic layer, magnetic domains of the first predetermined perpendicular magnetic layer can be moved to the second predetermined perpendicular magnetic layer, alternatively magnetic domains of the second predetermined perpendicular magnetic layer can be moved to the first predetermined perpendicular magnetic layer.

In addition, the data storage device of FIG. 1 includes a read/write head H reading and writing data. The read/write head H may be formed on a part of the horizontal magnetic layer 200 adjacent to the common buffer area B. Since the magnetic domain wall of the common buffer area B can be moved in all directions, the read/write head H may be formed on four parts of the second horizontal magnetic layers 200b adjacent to the common buffer area B. The position of the read/write head H may be altered. For example, the read/write head H may be formed on the side of the upper part of the common buffer area B. Although FIG. 1 illustrates the read/write head H for both reading and writing operations, the read/write head H can be separated into a read head and a write head.

The all-in-one type read/write head H may include first and second ferromagnetic pinned layers formed on lower and upper surfaces of a part of the magnetic layer 300 which is a unit bit. The first and second ferromagnetic pinned layers have opposite magnetization directions, and an insulating spacer interposed between each of the first and second ferromagnetic pinned layers and the magnetic layer 300. The kind of data recorded in the magnetic layer 300 is determined according to a direction of a current applied to the first and second ferromagnetic pinned layers. By measuring the electrical resistance between one of the first and second ferromagnetic pinned layers and the magnetic layer 300, the kind of data recorded in the magnetic layer 300 can be distinguished. Meanwhile, when the read/write head H is separated into a read head and a write head, the read head and the write head may each be a giant magneto resistance (GMR) head or a tunnel magneto resistance (TMR) head.

When the magnetic domain wall is pushed from a predetermined storage area to the common buffer area B or is pushed from the common buffer area B to the predetermined storage area by the transistors T, the read/write head H performs the read/write operations. Hereinafter, a method of operating the data storage device of the present invention will be described.

Figure 2:
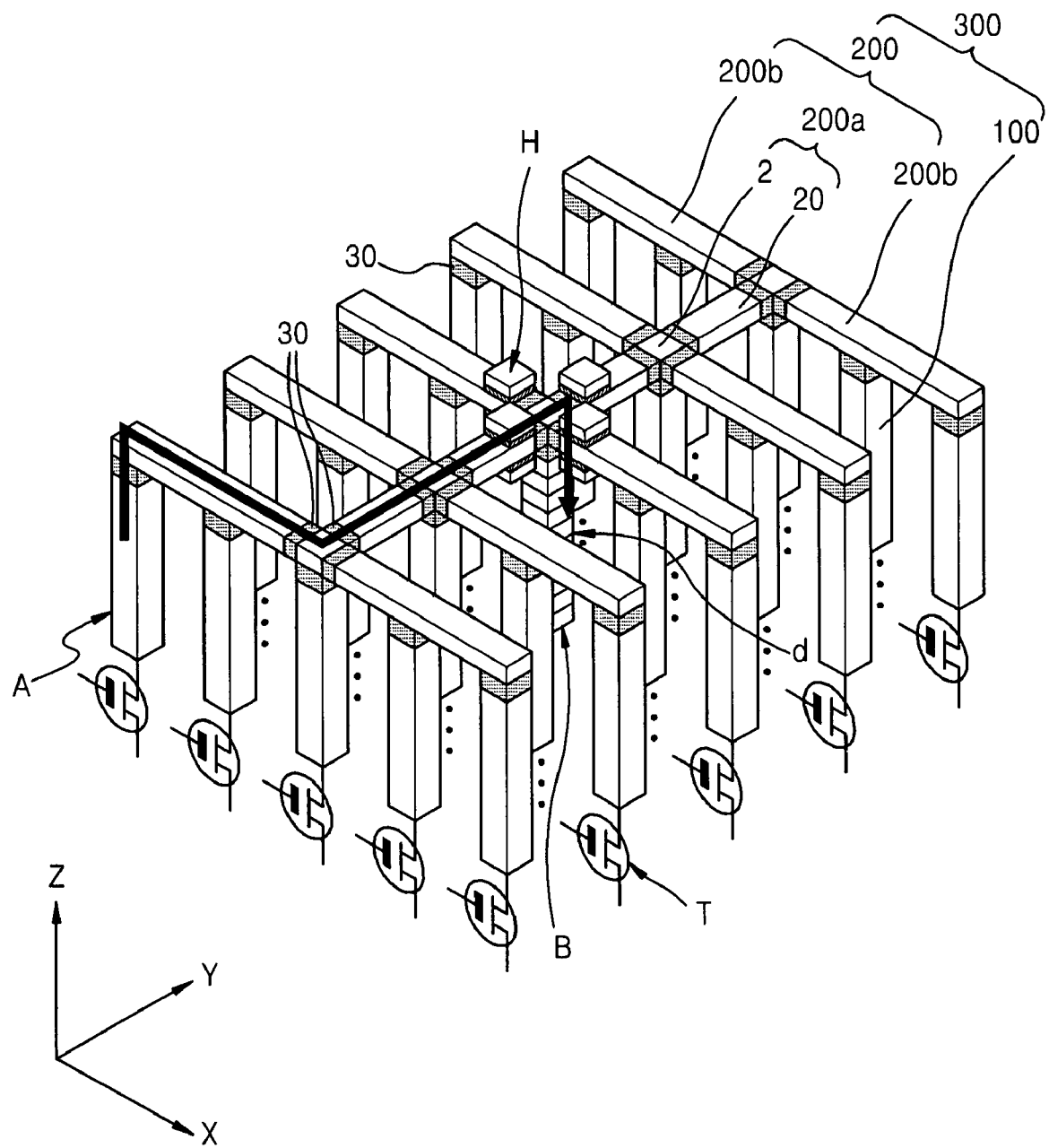
FIGS. 2 and 3 are perspective views illustrating a writing operation of the data storage device of FIG. 1, according to an exemplary embodiment of the present invention.
Figure 3:
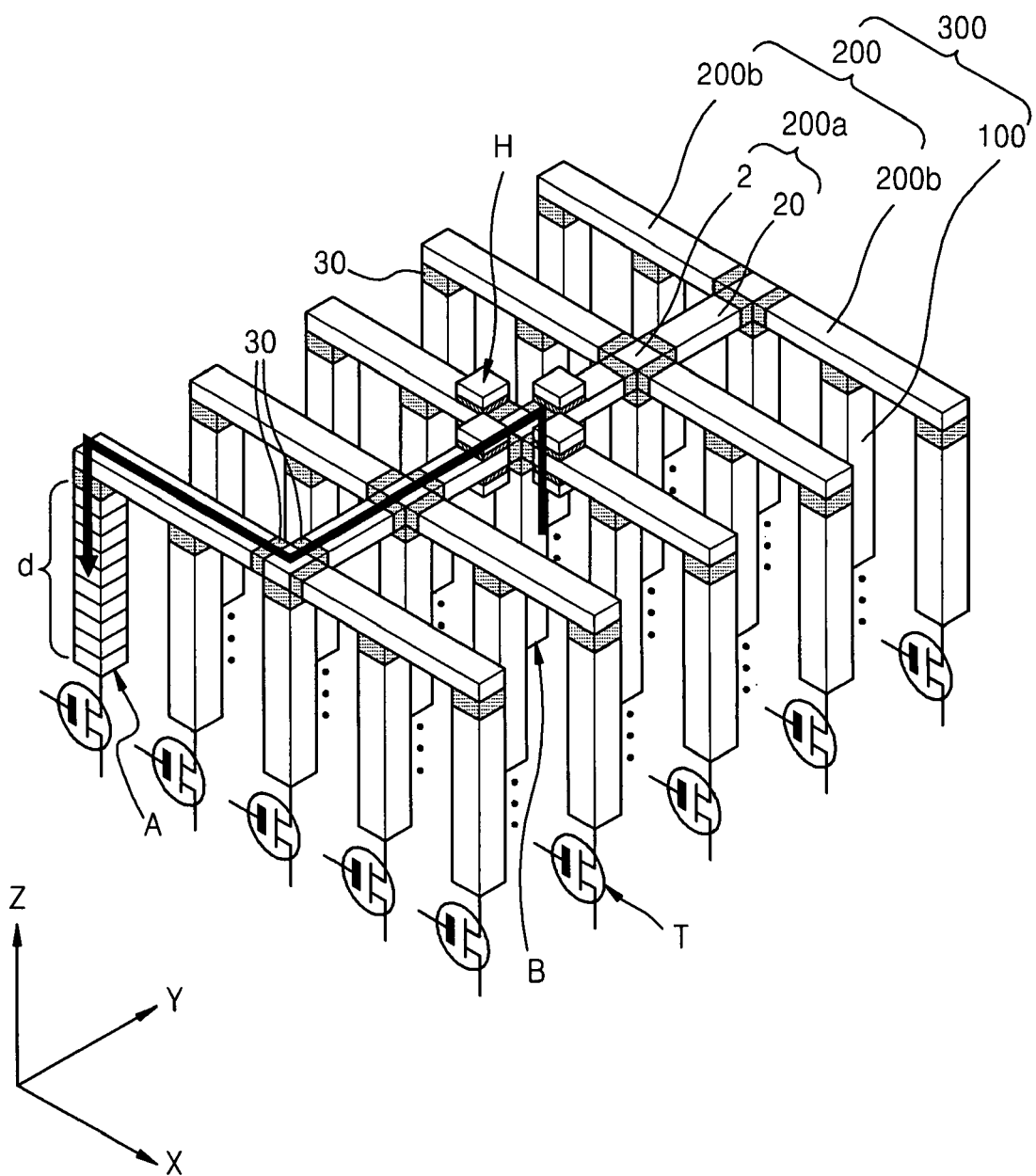

FIGS. 2 and 3 are perspective views illustrating a writing operation of the data storage device of FIG. 1, according to an exemplary embodiment of the present invention.

<Writing Operation>

Referring to FIG. 2, a first current is applied between a first perpendicular magnetic layer A formed in a first left row and a second perpendicular magnetic layer B formed on the center of the magnetic layer 300. Then, when magnetic domains are moved by one bit from the first perpendicular magnetic layer A to the second perpendicular magnetic layer B, the read/write head H records predetermined data to the magnetic domains. The magnetic domains and magnetic domain walls are moved in electrons movement direction, that is, an opposite direction to the first current direction. A predetermined writing current is applied to the read/write head H. Thus, magnetic domains d, in which the data is recorded, are disposed on the second perpendicular magnetic layer B.

Referring to FIG. 3, a second current having an opposite direction to the first current is applied between the first perpendicular magnetic layer A and the second perpendicular magnetic layer B. By moving the magnetic domains d, in which the data is recorded, from the second perpendicular magnetic layer B to first perpendicular magnetic layer A, the magnetic domains d are disposed on the first perpendicular magnetic layer A. That is, an operation of recording the data on the first perpendicular magnetic layer A is completed.

Data can be recorded on other perpendicular magnetic layers using the above method.

Figure 4:
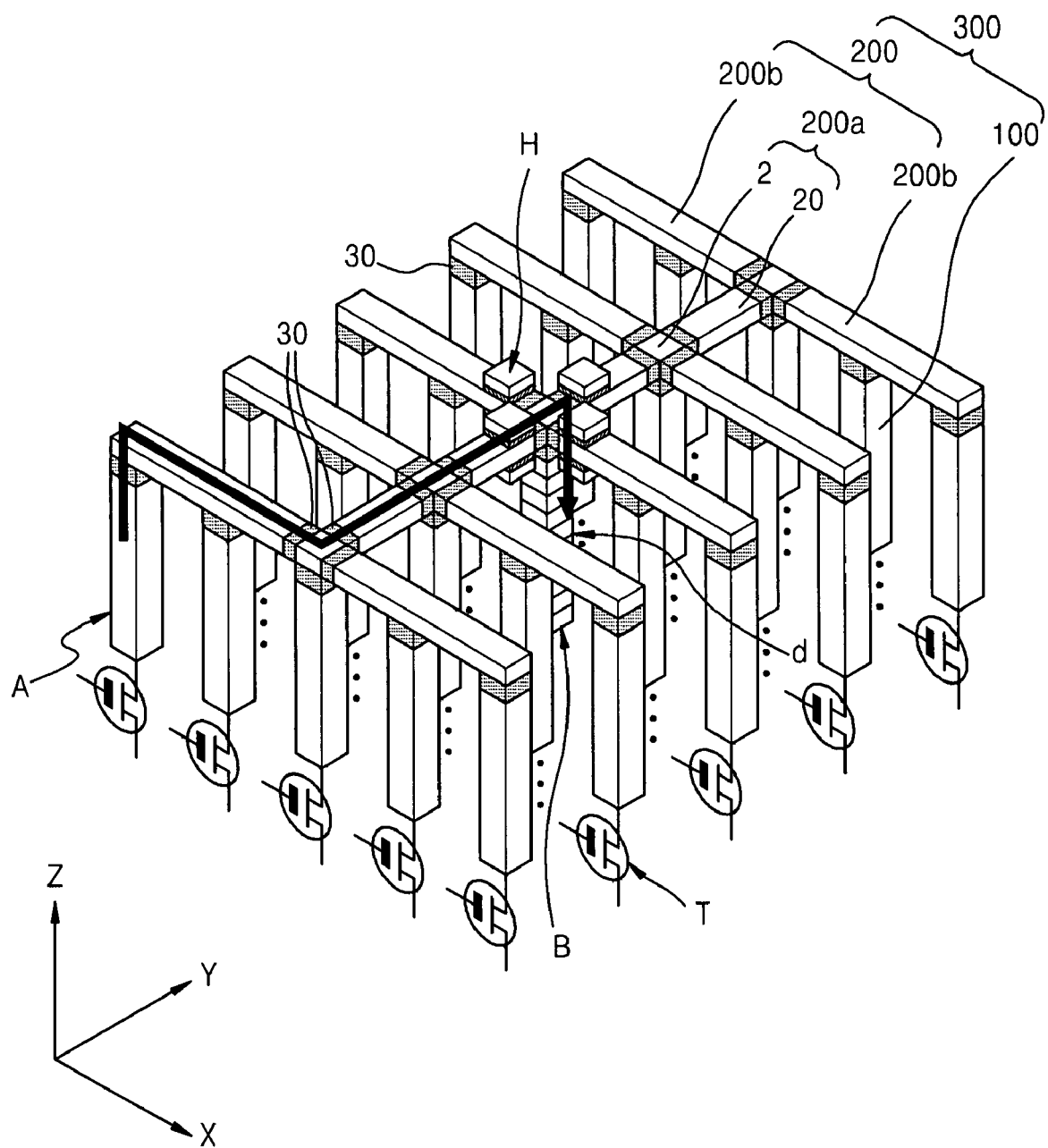
FIGS. 4 and 5 are perspective views illustrating a reading operation of the data storage device of FIG. 1, according to an exemplary embodiment of the present invention.
Figure 5:
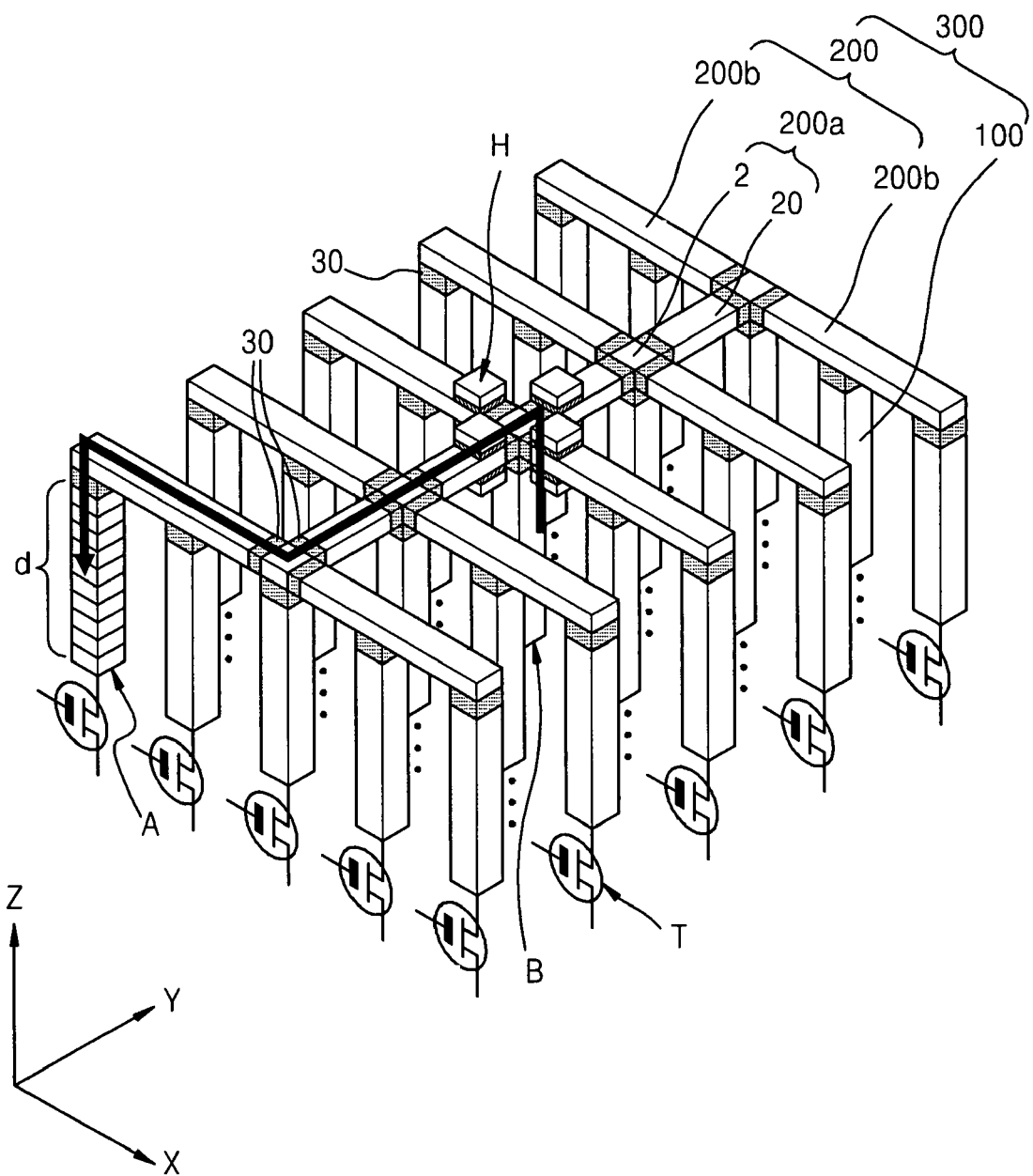

FIGS. 4 and 5 are perspective views illustrating a reading operation of the data storage device of FIG. 1, according to an exemplary embodiment of the present invention <Reading Operation>

Referring to FIG. 4, when the data is recorded on the first perpendicular magnetic layer A as illustrated in FIG. 3, the first current is applied between the first perpendicular magnetic layer A and the second perpendicular magnetic layer B. When the magnetic domains d are moved by one bit from the first perpendicular magnetic layer A to the second perpendicular magnetic layer B, the read/write head H reads data recorded on the magnetic domains d. A detection current for reading is applied to the read/write head H and/or the magnetic layer 300. Thus, the reading operation is performed by moving the magnetic domains d, in which the data is recorded, from the first perpendicular magnetic layer A to the second perpendicular magnetic layer B.

Referring to FIG. 5, the second current is applied between the first perpendicular magnetic layer A and the second perpendicular magnetic layer B. Then, the magnetic domains d are moved, in which the data is recorded, from the second perpendicular magnetic layer B to the first perpendicular magnetic layer A. Thus, the magnetic domains d are returned to the position of a pre-stage of the reading operation.

Data recorded in other perpendicular magnetic layers can be read using the above method.

As described above, since the data storage device of the present invention uses the central part of the perpendicular magnetic layers 100 constituting a two dimensional arrangement as the common buffer area B, the ratio of a buffer area with respect to a storage area is minimized, and a movement distance between the buffer area and the storage area is minimized. According to the current exemplary embodiment of the present invention, the recording density of the data storage device using domain wall movement can be higher, and a data access time can be reduced.

If twenty five perpendicular magnetic layers are arranged in one line, and the central perpendicular magnetic layer is used as a buffer area, much current is required and a long time is needed in order to move data from the buffer area to both ends of the perpendicular magnetic layers. In addition, if all perpendicular magnetic layers of the central row are used as a buffer area without the connection pattern 20 in FIG. 1, the ratio of a buffer area with respect to a storage area is more increased to reduce recording density, and many read/write heads are required.

Meanwhile, the resistance magnetic layers 30 prevent the current from leaking to an undesired part during the reading/writing operations. Since the resistance magnetic layers 30 act as a relatively low electric threshold, the resistance magnetic layers 30 disposed within a current path do not disturb the flow of the current. However, the resistance magnetic layers 30 disposed on a side or lower surfaces of a current path prevent the current from leaking to an undesired part. Accordingly, the magnetic domain wall can be smoothly moved by the current in the data storage device of the present invention.

According to the present invention, by using the central perpendicular magnetic layer of the perpendicular magnetic layers 100 arranged in two, dimensionally as a common buffer area, the recording density of the data storage device can be higher and a data access time can be shorter.

In the present invention, the transistors T formed on a substrate (not shown) is easily connected to the perpendicular magnetic layers 100 in manufacturing processes.

In addition, since the resistance magnetic layers 30 formed on an intersection part of the perpendicular and the horizontal magnetic layers 100 and 200 prevent current from leaking, the magnetic domain wall is smoothly moved.

Meanwhile, it will be understood by those of ordinary skill in the art that various changes may be made in the number of the perpendicular magnetic layers 100, the arrangement of the perpendicular magnetic layers 100, the position of the first horizontal magnetic layer 200a, the structure of the first horizontal magnetic layer 200a, or the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A data storage device comprising:
    a magnetic layer which has a plurality of magnetic domains,
    a current applying unit which applies a current for a magnetic domain wall movement to the magnetic layer,
    and a head for reading and writing,
    wherein the magnetic layer comprises a plurality of perpendicular magnetic layers formed on a substrate in an array including a plurality of rows and columns, and a horizontal magnetic layer formed on the perpendicular magnetic layers to connect the perpendicular magnetic layers to one another in a row direction and a column direction.

2. The data storage device of claim 1, wherein the horizontal magnetic layer comprises:
    a first horizontal magnetic layer which is formed on the perpendicular magnetic layers of a middle column so as to be connected to the perpendicular magnetic layers of the middle column;
    a second horizontal magnetic layer which extends from both sides of the first horizontal magnetic layer and is formed so as to be connected to the perpendicular magnetic layers of each row.

3. The data storage device of claim 2, wherein the first horizontal magnetic layer comprises:
    dot patterns which are formed on the perpendicular magnetic layers of the middle column; and
    connection patterns which connect the dot patterns.

4. The data storage device of claim 1, wherein a resistance magnetic layer which has higher electric resistance than that of the magnetic layer is interposed between each of the perpendicular magnetic layers and the horizontal magnetic layer.

5. The data storage device of claim 2, wherein a resistance magnetic layer which has higher electric resistance than that of the magnetic layer is interposed between the first horizontal magnetic layer and the second horizontal magnetic layer.

6. The data storage device of claim 3, wherein a resistance magnetic layer which has higher electric resistance than that of the magnetic layer is interposed between each of the dot patterns and the connection patterns.

7. The data storage device of claim 1, wherein at least one of the perpendicular magnetic layers acts as a buffer area during reading/writing operations.

8. The data storage device of claim 1, wherein at least one of the perpendicular magnetic layers of the middle column acts as a buffer area during reading/writing operations.

9. The data storage device of claim 1, wherein a central layer of the perpendicular magnetic layers of the middle column acts as a buffer area during reading/writing operations.

10. The data storage device of claim 1, wherein the current applying unit comprises a transistor which is connected to a lower surface of each of the perpendicular magnetic layers.

11. The data storage device of claim 1, wherein the head comprises a write head and a read head.

12. The data storage device of claim 7, wherein the head is formed on parts of the horizontal magnetic layers adjacent to the buffer area.

13. The data storage device of claim 7, wherein the head is formed on a side of upper part of the buffer area.

* * * * *